(12) United States Patent
Nakamura et al.

(10) Patent No.: US 8,956,513 B2
(45) Date of Patent: Feb. 17, 2015

(54) SUBSTRATE PROCESSING METHOD

(75) Inventors: Shinya Nakamura, Susono (JP); Yoshinori Fujii, Susono (JP); Hideto Nagashima, Susono (JP)

(73) Assignee: Ulvac, Inc., Kanagawa (JP)

( * ) Notice: Subject to any disclaimer, the term of this patent is extended or adjusted under 35 U.S.C. 154(b) by 100 days.

(21) Appl. No.: 13/378,534

(22) PCT Filed: Jul. 15, 2010

(86) PCT No.: PCT/JP2010/004617
§ 371 (c)(1),
(2), (4) Date: Jan. 27, 2012

(87) PCT Pub. No.: WO2011/007580
PCT Pub. Date: Jan. 20, 2011

(65) Prior Publication Data
US 2012/0111833 A1 May 10, 2012

(30) Foreign Application Priority Data
Jul. 17, 2009 (JP) ................................. 2009-169265

(51) Int. Cl.
C23C 14/56 (2006.01)
C23C 14/06 (2006.01)
C23C 14/00 (2006.01)

(52) U.S. Cl.
CPC ............. C23C 14/0641 (2013.01); C23C 14/56 (2013.01); C23C 14/0036 (2013.01); C23C 14/568 (2013.01)
USPC ............ 204/192.15; 204/298.01; 204/298.11; 216/58; 427/255.394

(58) Field of Classification Search
CPC ............................... C23C 14/56; C23C 14/564
See application file for complete search history.

(56) References Cited

U.S. PATENT DOCUMENTS

2003/0024810 A1* 2/2003 Smith et al. ............... 204/298.01
2004/0182698 A1* 9/2004 Feltsman ................. 204/298.11

FOREIGN PATENT DOCUMENTS

| JP | 07-011442 A | 1/1995 |
| JP | 07-048669 A | 2/1995 |
| JP | 11-045929 A | 2/1999 |
| JP | 2004-128210 A | 4/2004 |
| JP | 2005-298894 A | 10/2005 |

OTHER PUBLICATIONS

International Search Report for PCT Patent App. No. PCT/JP2010/004617 (Aug. 31, 2010).

* cited by examiner

*Primary Examiner* — Keith Hendricks
*Assistant Examiner* — Timon Wanga
(74) *Attorney, Agent, or Firm* — Cermak Nakajima & McGowan LLP; Tomoko Nakajima

(57) ABSTRACT

There is provided a substrate processing method, in which a throughput can be improved even in case the time for recovery processing for restoring the state of a processing chamber is longer than the time for predetermined processing to be performed in the processing chamber. Substrates are alternately transferred to two processing chambers C, D, and the same film forming processing is performed on the substrates in the processing chambers C, D in parallel with each other. When the number of substrates processed in the processing chamber C has reached a predetermined number (11 substrates), dummy sputtering processing in the film forming chamber C is started and also 23rd-25th substrates of the first lot are transferred to the film forming chamber D to thereby perform film forming processing until the dummy sputtering processing is finished.

3 Claims, 4 Drawing Sheets (a) EMBODIMENT OF THIS INVENTION (b) PRIOR ART

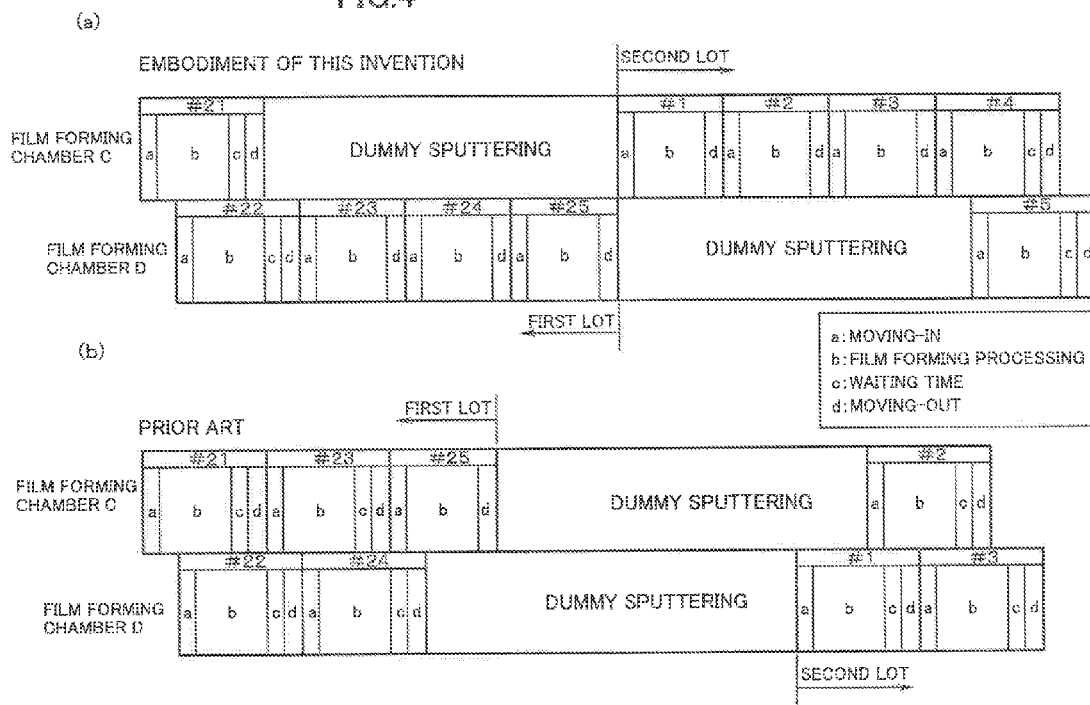

SUBSTRATE PROCESSING METHOD

This application is a national phase entry under 35 U.S.C. §371 of PCT Patent Application No. PCT/JP2010/004617, filed on Jul. 15, 2010, which claims priority under 35 U.S.C. §119 to Japanese Patent Application No. 2009-169265, filed Jul. 17, 2009, both of which are incorporated by reference.

TECHNICAL FIELD

The present invention relates to a substrate processing method in which the same processing is performed in parallel with each other in at least two processing chambers and, when the number of substrates that have been processed in each of the processing chambers has reached a predetermined number, recovery processing is performed in order to recover the state of each of the processing chambers.

BACKGROUND ART

As a processing apparatus for performing film forming processing on substrates, there is known, as shown in FIG. 1, a sputtering apparatus 100 equipped with: a transfer chamber T; a transfer robot 1 having two robot hands 12a, 12b which are housed in the transfer chamber T; and two load-lock chambers A, B and two film forming chambers C, D which serve as processing chambers, all being disposed in a manner to enclose the transfer chamber T.

In the above-mentioned sputtering apparatus 100, substrates which are handled by the unit of a lot (e.g., 25 substrates) and which are housed inside substrate containers 4 placed in position on a loading port 3, are alternately charged by a robot 30 into the load-lock chambers A, B, and the charged substrates are respectively transferred to the film forming chambers C, D by the transfer robot 1. Then, the same film forming processing is performed on the substrates in parallel with each other in the two film forming chambers C, D.

When the same processing is performed on the substrates in parallel with each other in the two film forming chambers C, D, in case, e.g., the time required for processing the substrates in the load-lock chambers A, B is longer than the time required for processing the substrates in the film forming chambers C, D, or in case the speed of the transfer robot 1 or of the robot 30 is so low as to cause a rate-determining step (bottleneck), and the like, the substrates cannot be discharged (also called "moved out") right after the completion of the processing in each of the film forming chambers C, D. As a result, waiting time occurs. If this waiting time can be effectively shortened, a further improvement in the throughput can be attained.

By the way, it is known that the sputtering apparatus 100 is applied to the forming of a titanium nitride (TiN) film, e.g., by reactive sputtering (see, e.g., patent document 1). When film forming is made of titanium nitride, there is a problem in that, with an increase in the number of substrates that have been processed, the number of particles to be accumulated on the surface of the substrate, during film forming, will increase. As a solution, when the number of substrates that have been processed in the processing chambers has reached a predetermined number (that may be set arbitrarily), Ti target is shielded by a shutter which prevents the sputtered particles of the target from getting scattered, thereby performing a dummy sputtering processing (so-called recovery processing). This kind of dummy sputtering processing is performed, e.g., each time the processing by the unit of a lot is finished. In other words, when 25 substrates are supposed to make one lot, when the number of the substrates processed in any one of the film forming chambers has reached a predetermined number (12 substrates), the dummy sputtering processing is started in said one of the film forming chambers. When the number of the substrates processed in the other of the film forming chambers has reached a predetermined number (13 substrates), the dummy sputtering processing is started in said the other of the film forming chambers. At this time, if the time required for dummy sputtering processing is longer than the time required for processing of substrates in the film forming chambers, the dummy sputtering processing will be performed in the two film forming chambers in a manner overlapped with each other. In such a case, it will be similar to the case in which the processing for a predetermined period of time is interposed in both the film forming chambers between the two lots. Therefore, this solution does not contribute to the shortening of the waiting time.

PRIOR ART DOCUMENT

Patent Document

Patent Document 1: JP-A-2004-128210

SUMMARY OF THE INVENTION

Problems to be Solved by the Invention

In view of the above points, this invention has a problem of providing a substrate processing method in an arrangement in which substrates are alternately transferred to at least two processing chambers so as to perform, in parallel to each other, the same processing to each of the substrates and also the recovery processing of the processing chambers in between, the substrate processing method being capable of improving the throughput when the recovery processing time is longer than the time for processing of substrates.

Means for Solving the Problems

In order to solve the above problems, this invention is a substrate processing method, wherein a substrate is alternately transferred to at least two processing chambers, same processing is performed on the substrate in each of the processing chambers, recovery processing is performed to recover a state of each of the processing chambers when a number of substrates processed therein has reached a predetermined number, and wherein time required for the recovery processing is longer than time required for processing of substrates. The method comprises: when the number of substrates processed in any one of the processing chambers has reached the predetermined number, starting the recovery processing in said any one of the processing chambers and, during the time until the recovery processing in said any one of the processing chambers is finished, transferring substrates only to the other of the processing chambers to thereby perform the processing of substrates; when the recovery processing in said any one of the processing chambers has been finished, starting the recovery processing in the other of the processing chambers and, during the time until the recovery processing in the other of the processing chambers is finished, transferring substrates only to said any one of the processing chambers to thereby perform the processing of substrates; and resuming the alternate transferring of substrates when the recovery processing in the other of the processing chambers has been finished.

By the way, according to this invention, the above-mentioned processing of substrates shall be understood to include the film forming (film deposition) processing, etching processing, and the like. The above-mentioned recovery processing shall be understood to include dummy sputtering processing, dry cleaning, seasoning, and the like. Further, the time required for processing of substrates shall be understood to include, in addition to the time of film forming, the time of etching and the like, the time of moving a lifter (lift pin) which is disposed in a stage on which the substrate is placed in position, the time of transferring the substrates (time for moving substrates into, referred to also as move-in time; and time for moving substrates out, referred to also as move-out time), and the like. Still furthermore, the time of recovery processing shall be understood to include, in addition to the time of dummy sputtering processing, the time of dry cleaning and the like, the time of moving the above-mentioned lifter, the time of transferring the substrates, the time of operating the shutter when the target is shielded by the shutter, and the like. Further, the predetermined number of substrates may be arbitrarily set depending on the processing to be performed in the processing chambers.

In this invention, an arrangement may be made that the time for starting the recovery processing in said any one of the processing chambers such that the recovery processing performed in said any one of the processing chambers is finished simultaneously with the time when the number of substrates processed in the other of the processing chambers has reached the predetermined number. In this invention, the term "simultaneously" does not always mean strict coincidence but, despite the occurrence of a slight time difference corresponding to the time of moving the above-mentioned lifter, the time of transferring the substrates, the time of operating the shutter, and the like, the term shall be understood to include a case in which both of the above-mentioned time are substantially identical to each other.

In this invention, preferably the processing of substrates is the processing to form a titanium nitride film on a surface of each of the substrates by reactive sputtering using a Ti target, and the recovery processing is a dummy sputtering in which the Ti target is sputtered while shielding the Ti target by a shutter which prevents the sputtered particles of the Ti target from getting scattered. In this invention, it is preferable to perform the same processing operations in the two processing chambers.

Effect of the Invention

According to this invention, an arrangement has been made such that the recovery processing is not performed in duplicate in each of the processing chambers and that, while the recovery processing is being performed in said any one of the processing chambers, the processing of substrates is performed in the other of the processing chambers. Here, in case processing of substrates is performed only in one of the processing chambers, there is no need of taking into consideration the processing states in other processing chambers. Since the substrate can be moved out (discharged) right after the completion of the processing, no waiting time occurs. As a result, the waiting time can be effectively shortened while performing the recovery processing, whereby the throughput can be improved.

BRIEF DESCRIPTION OF THE DRAWINGS

FIG. 4(a) is a schematic diagram to explain the waiting time in the substrate processing method according to the embodiment of this invention, and FIG. 4(b) is a schematic diagram to explain the waiting time in the conventional substrate processing method (prior art).

EMBODIMENTS FOR CARRYING OUT THE INVENTION

Detailed description will hereinafter be made of embodiments of this invention.

Figure 1:
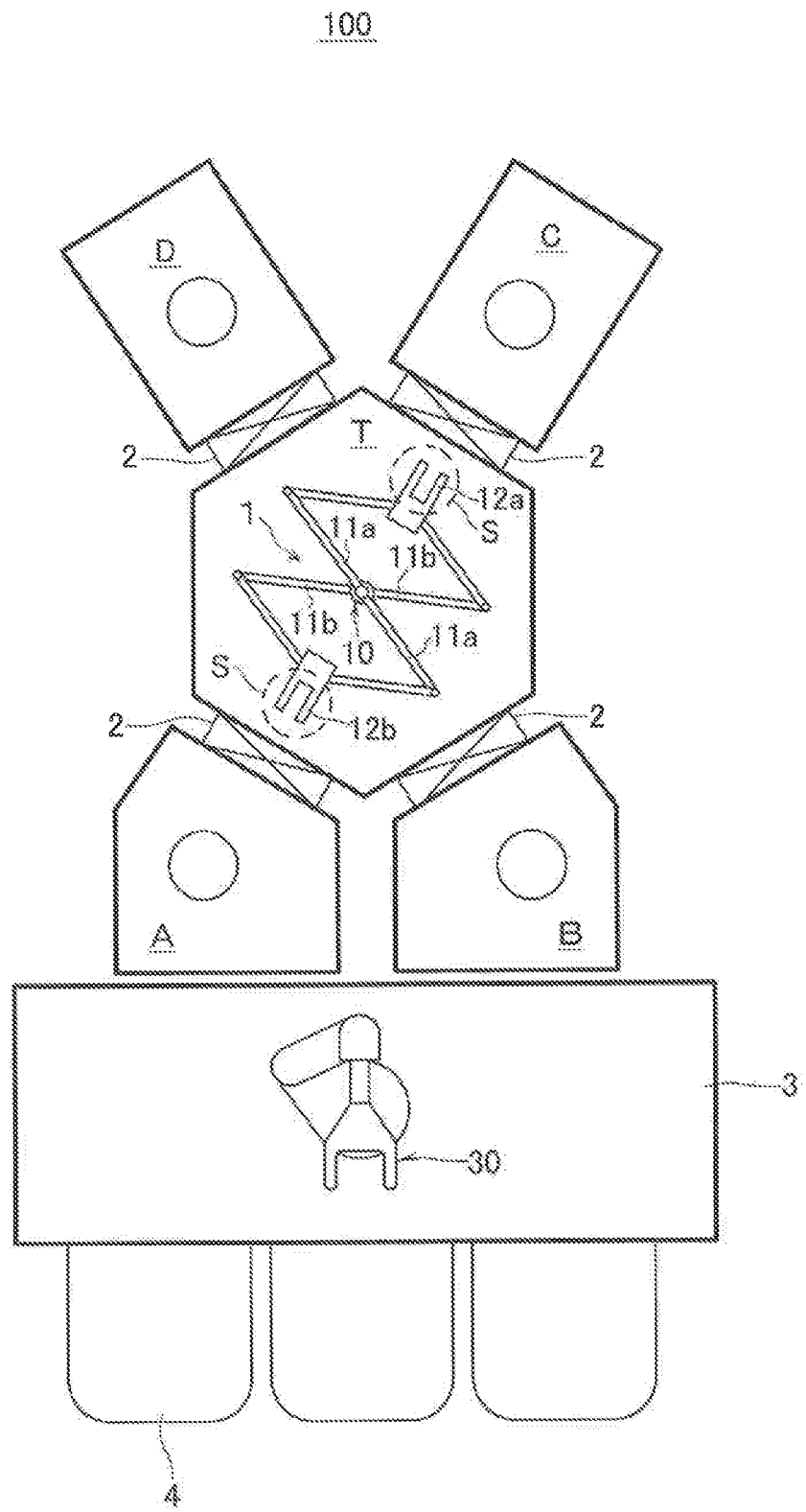
FIG. 1 is a schematic plan view showing a film forming apparatus according to one embodiment of this invention.

FIG. 1 shows a sputtering apparatus which is an example of a film forming apparatus according to this invention. The sputtering apparatus 100 is equipped with: a transfer chamber T which houses therein a transfer robot 1; two load-lock chambers A, B and two film forming chambers which serve as processing chambers C, D, all of which are disposed so as to enclose the transfer chamber T. It is thus so arranged that the substrates S charged into the load-lock chambers A, B are transferred to the film forming chambers C, D by means of the transfer robot 1.

Between the transfer chamber T and the load-lock chambers A, B as well as between the transfer chamber T and the film forming chambers C, D, there are respectively interposed isolation valves 2. Since the construction of the transfer chamber T and the load-lock chambers A, B is known, a detailed description thereof will be omitted.

Close to the load-lock chambers A, B of the sputtering apparatus 100, there is disposed a loading port 3. This loading port 3 is made up of a known mechanism for mounting thereon a plurality of substrate housing containers (e.g., Front Opening Unified Pods, FOUPs) 4, and a robot 30 which charges substrates into the load-lock chambers A, B by the unit of a lot (e.g., 25 substrates) that is housed in each of the substrate housing containers 4.

The transfer robot 1 for transferring the substrates S between the load-lock chambers A, B and the film forming chambers C, D is an articulated robot of a known construction, and is provided with: robot arms 11a, 11b as operating parts; and a plurality of motors 10 as driving means for driving the robot arms 11a, 11b in a rotatable and telescopically movable manner. To the front end of each of these robot arms 11a, 11b, there is respectively connected a robot hand 12a, 12b which holds a substrate S in a manner in which it is placed on the robot hand. As a result of repetition by the transfer robot 1 of the following operations (a)-(h), the substrates S alternately charged into the load-lock chambers A, B can be respectively transferred to the film forming chambers C, D.

(a) In a state in which the processed substrate is held by the robot hand 12a, an unprocessed substrate in the load-lock chamber A is moved out by the robot hand 12b.
(b) The processed substrate that is held by the robot hand 12a is moved into the load-lock chamber A.
(c) The substrate that has been processed in the film forming chamber C is moved out by the robot hand 12a.
(d) An unprocessed substrate that is held by the robot hand 12b is moved into the film forming chamber C.
(e) An unprocessed substrate in the load-lock chamber B is moved out by the robot hand 12b.

(f) The processed substrate that is held by the robot hand 12a is moved into the load-lock chamber B.
(g) The substrate that has been processed in the film forming chamber D is moved out by the robot hand 12a.
(h) An unprocessed substrate that is held by the robot hand 12b is moved into the film forming chamber D.

The film forming chambers C, D have the same construction and are arranged to perform the same film forming processing. These film forming chambers C, D are sputtering chambers in which TiN films are formed on the surfaces of the substrates, e.g., by reactive sputtering.

Figure 2:
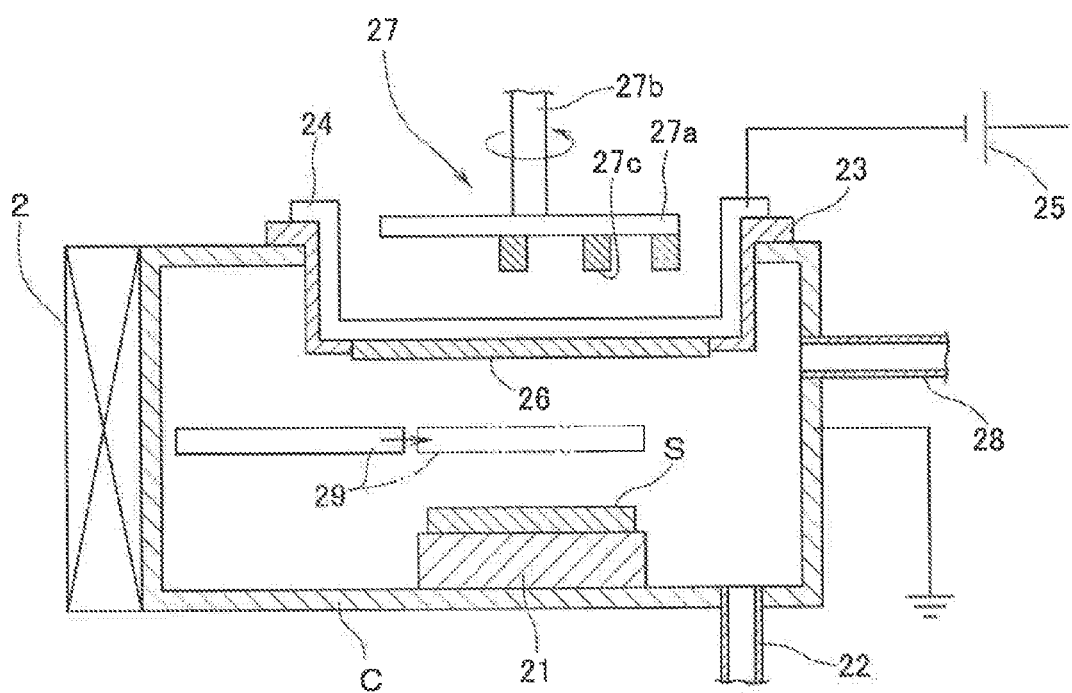
FIG. 2 is a schematic sectional view showing a film forming chamber C of FIG. 1.

With reference to FIG. 2, a description will now be made of the construction of the film forming chamber C as a representative example. At the bottom of the film forming chamber C, there is disposed a stage 21 on which a substrate S is placed in position. The stage 21 is provided with a lifter (lift pin) of a known construction although not illustrated. This lifter is arranged to move up and down at the time of delivering the substrate S relative to the stage 21. To that bottom portion of the film forming chamber C which lies around the stage 21, there is connected an exhaust pipe 22, and this exhaust pipe 22 is in communication with an exhaust means (not illustrated) such as a vacuum pump and the like.

In an opening at a ceiling portion of the film forming chamber C, there is provided a cathode electrode 24 through an electrically insulating material 23. The cathode electrode 24 is connected to a DC power source which is a power supply 25 for the cathode. On that front surface (lower surface in the figure) of the cathode electrode 24 which lies on the side of the substrate, there is provided a target 26 which is made of a film-forming material such, for example, as Ti and the like. On a rear-surface side of the cathode electrode 24, there is disposed a magnet unit 27 which forms a magnetic field in front of the sputtering surface so that a desired plasma density can be obtained in the neighborhood of the sputtering surface of the Ti target 26. The magnet unit 27 has a rotary disc 27a, a rotary shaft 27b which is fixed to the upper surface of the rotary disc 27a, and a plurality of magnets 27c which are disposed on the lower surface of the rotary disc 27a.

In addition, to the side wall of the grounded film forming chamber C, there is connected one end of a gas pipe 28. The opposite end of the gas pipe 28 is in communication with a gas source through a mass flow controller (not illustrated). The gas source is, for example, an $N_2$ supply source and an Ar supply source.

Further, inside the film forming chamber C, there is provided a shutter 29 which is movable in the horizontal direction in a space between the stage 21 and the Ti target 26. This shutter 29 is to prevent the sputtered particles of the Ti target 26 from scattering to the stage 21.

According to the above-mentioned arrangement of the film forming chamber C, by controlling the pressure inside the film forming chamber C to a predetermined pressure while supplying the reaction gas from the gas pipe 28 into the film forming chamber C, and by supplying electric power from the cathode power supply 25 to the cathode electrode 24, a TiN film can be formed on the surface of the substrate S that is disposed on the stage 21. The film forming conditions of the TiN film are, e.g., as follows.

[TiN Film Forming Conditions]
Sputtering power: 12 kW
Ratio of nitrogen gas in the reaction gas (=$N_2$ flow rate/(Ar flow rate+$N_2$ flow rate)): 75%
Sputtering pressure: 0.1 Pa
Processing time: 80 seconds (=10 seconds for move-in time+ 60 seconds for film forming+10 seconds for move-out time)

As described above, with an increase in the number of substrates to be processed in the processing chambers C, D, the number of particles to be accumulated on the surfaces of the substrates during film forming processing will increase. When the number of substrates that have been processed in the film forming chambers C, D has reached a predetermined number, it is necessary to shield the Ti target 26 with the shutter 29 and to perform dummy sputtering processing in which the Ti target is sputtered, thereby recovering the state of the film forming chambers C, D. The dummy sputtering conditions are, for example, as follows.

Figure 3:
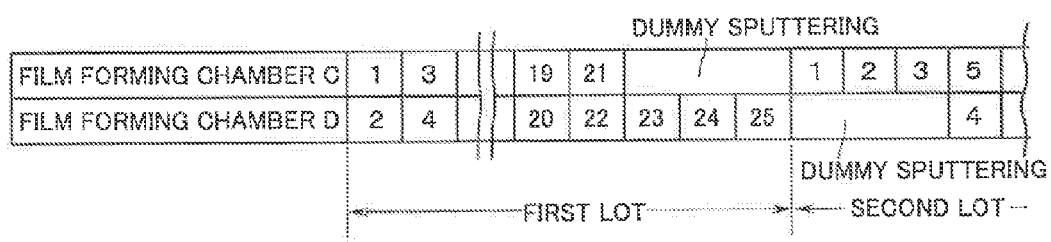
FIG. 3(a) is a schematic diagram to explain the substrate processing method according to this embodiment.
FIG. 3(b) is a schematic diagram to explain the substrate processing method according to the prior art.
Figure 3:
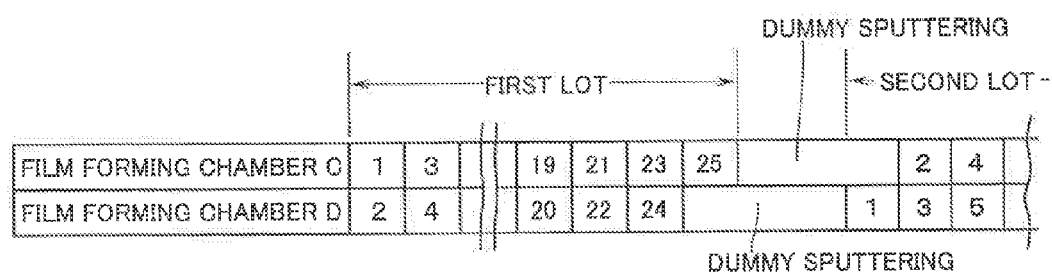

[Dummy Sputtering Processing Conditions]
Sputtering power: 12 kW
Ratio of nitrogen gas in the reaction gas (=$N_2$ flow rate/(Ar flow rate+$N_2$ flow rate)): 90%
Sputtering pressure: 0.1 Pa
Processing time: 240 seconds With reference to FIG. 3, a description will now be made of a substrate processing method according to this embodiment. The reference numerals used in the figure show how manieth substrates of the first lot and the second lot are the substrates that are under processing in the film forming chambers C, D. In FIG. 3, illustration is omitted of the dummy sputtering processing to be performed before the first lot.

As described above, by operating the transfer robot 1, it is possible to transfer the 1st, the 2nd, and subsequent substrates in the first lot that have been alternately charged into the two load-lock chambers A, B into the two film forming chambers C, D respectively, thereby performing the same film forming processing in parallel with each other in these two film forming chambers C, D (see FIG. 3).

It is to be noted here that, in the conventional substrate processing method as shown in FIG. 3(b), when the film forming processing for the 24th substrate of the first lot in the film forming chamber D has been finished, in other words, when the number of substrates that have been processed in the processing chamber D has reached a predetermined number (12 substrates that is one half of 25 substrates), dummy sputtering processing is started in the film forming chamber D. Then, when the number of substrates that have been processed in the film forming chamber C has reached a predetermined number (13 substrates), dummy sputtering processing in the film forming chamber C is started. At this time, since the time required for dummy sputtering processing is longer than the time required for processing substrates in the film forming chambers C, D, the dummy sputtering processing will be performed in a manner overlapped with each other in the two film forming chambers C, D. In such a case, since the same film forming processing is performed in the two film forming chambers C, D in parallel with each other before and after the dummy sputtering processing, the consequence will be similar to the case in which a long time of processing is performed between the lots.

It is to be noted here that, when the same film forming processing is performed in a manner overlapped with each other in the two film forming chambers C, D, in case, e.g., the processing time in the load-lock chambers A, B is longer than the processing time in the film forming chambers C, D, or in case the speed of the transfer robot 1 is so low as to cause a rate-determining step (bottleneck) in transportation, the substrates cannot be moved out right after the completion of the processing in the film forming chambers C, D, whereby waiting time occurs. The conventional substrate processing method cannot effectively shorten this kind of waiting time, and cannot improve the throughput.

On the other hand, in the substrate processing method according to the embodiment of this invention, when the number of substrates that have been processed in any one of the film forming chambers has reached a predetermined number, dummy sputtering processing is performed in advance. In the example shown in FIG. 3(a), when the number of substrates that have been processed in the film forming chamber C has reached a predetermined number (11 substrates), dummy sputtering processing is started in the film forming chamber C.

It is to be noted here that the time of starting the dummy sputtering processing in the film forming chamber C can be determined such that the dummy sputtering processing in the film forming chamber C is finished at the same time as the finishing of the film forming processing of the 25th substrate of the first lot in the film forming chamber D. Specifically, since the processing time of the dummy sputtering processing corresponds to the processing time of three substrates, the number of substrates that have not been processed yet in the first lot becomes three. When the film forming processing of the 21st substrate in the first lot has been finished in the film forming chamber C, the dummy sputtering processing is started in the film forming chamber C. According to this arrangement, right after the finishing of the dummy sputtering processing in the film forming chamber C, the dummy sputtering processing in the film forming chamber D can be started.

While dummy sputtering processing is being performed in the film forming chamber C, the 23rd, the 24th, and the 25th substrates of the first lot are transferred only to the other D of the film forming chambers so as to perform the film forming processing. At this time, since there is no need of taking into consideration the processing states in the film forming chamber C, the 23rd, the 24th, and the 25th substrates of the first lot are moved out of the film forming chamber D right after finishing of the film forming processing. There is thus no waiting time that should otherwise occur in the conventional method.

When the film forming processing of the 25th substrate of the first lot has been finished in the film forming chamber D, dummy sputtering processing is started in the film forming chamber D. As described above, if the dummy sputtering processing in the film forming chamber C is finished at the same time as the finishing of the film forming processing of the 25th substrate of the first lot in the film forming chamber D, transfer of the substrate to the film forming chamber C becomes possible. Then, while the dummy sputtering processing is being performed in the film forming chamber D, the 1st, the 2nd, and the 3rd substrates of the second lot are transferred only to the film forming chamber C to perform the film forming processing therein. At this time, since there is no need of taking into consideration the processing states in the film forming chamber D, the 1st, the 2nd, and the 3rd substrates of the second lot are moved out of the film forming chamber C right after finishing of the film forming processing. There is thus no waiting time that should otherwise occur in the conventional method.

Thereafter, when the dummy sputtering processing in the film forming chamber D has been finished, alternate transfer of substrates between the two film forming chambers C, D is resumed. In other words, the 4th substrate and subsequent substrates of the second lot are alternately transferred to the film forming chambers C, D, and the same film forming processing is performed in parallel with each other in the film forming chambers C, D.

As described hereinabove, in this embodiment, in case the time required for dummy sputtering processing is longer than the time required for processing in the film forming chambers C, D, when the number of substrates that have been processed in the film forming chamber C has reached the predetermined number (11 substrates), dummy sputtering processing in the film forming chamber C is started in advance. Also, during the time until the dummy sputtering processing is finished, the substrates are transferred only to the film forming chamber D to perform the film forming processing therein. Then, after the dummy sputtering processing has been finished in the film forming chamber C, dummy sputtering processing is started in the film forming chamber D. Also, during the time until the dummy sputtering processing is finished in the film forming chamber D, the substrates are transferred only to the film forming chamber C to thereby perform the film forming processing therein. According to this arrangement, during the time when the dummy sputtering processing is being performed, the waiting time can be effectively shortened. As a result, the throughput can be improved.

Now, with reference to FIG. 4, a description will be made of the effect of this embodiment. Suppose that the processing time required in the load-lock chambers A, B is longer than the processing time required in the film forming chambers C, D. In other words, when the same film forming processing is performed in two film forming chambers C, D in parallel with each other, the processing in the load-lock chambers A, B will become a rate-determining step (bottleneck). In this case, the substrates are not moved out right after the film forming processing has been finished in the load-lock chambers C, D, thereby giving rise to waiting time. For example, suppose that the processing time required in the film forming chambers C, D is 80 seconds, and that the processing time required in the load-lock chambers A, B is 120 seconds. Then, the waiting time per one substrate will become 20 seconds (=120 seconds/2−80 seconds/2).

If the conventional substrate processing method is applied under this kind of situation, the dummy sputtering processing in the film forming chambers C, D will be performed in a manner overlapped with each other as shown in FIG. 4(b). In this case, only the 25th substrate of the first lot is moved out from the film forming chamber C right after the film forming processing has been finished. As a consequence, although there occurs no waiting time, the remaining substrates will not be moved out from the film forming chambers C, D right after the processing of substrates has been finished, thereby giving rise to the waiting time. Accordingly, even if the conventional substrate processing method is applied to the case in which a plurality of lots are processed in succession, the waiting time cannot be effectively shortened, whereby the throughput cannot be improved.

In this embodiment, on the other hand, as shown in FIG. 4(a), dummy sputtering processing in film forming chambers C, D is performed in a manner not overlapped with each other. In addition, during the time when the dummy sputtering processing is being performed in one of the film forming chambers C (D), the film forming processing that is performed in the other of the film forming chambers D (C) will become a rate-determining step. In other words, during the time when the dummy sputtering processing is being performed, the transfer robot 1 and the load-lock chambers A, B will wait for the finishing of the film forming processing in the film forming chambers D (C). As a result, the 23rd-25th substrates of the first lot will be moved out from the processing chamber D right after the finishing of the film forming processing has been finished, thereby giving rise to no waiting time. Similarly, the 1st-3rd substrates of the second lot will be driven away from the processing chamber C right after the finishing of the film forming processing has been finished, thereby giving rise to no waiting time. In this manner, according to this embodiment, an arrangement has been made that dummy sputtering processing is performed in a manner not overlapped with each other in the film forming chambers C, D and that, during the time when the dummy sputtering processing is being performed, the film forming processing is performed only in one film forming chamber. Therefore, the waiting time can be effectively shortened and the throughput can be improved. Suppose that the processing time in the film forming chambers C, D is 80 seconds, and that the processing time in the load-lock chambers A, B is 120 seconds. Then, the waiting time can be shortened by 20 seconds×6 substrates=120 seconds during the time when dummy sputtering is performed in the two film forming chambers C, D.

By the way, in the example shown in FIG. 4(a), the dummy sputtering processing in the film forming chamber C and the moving out of the 25th substrate of the first lot in the film forming chamber D are finished at the same time. Alternatively, an arrangement may be made such that, depending on the dummy sputtering processing time, the time required for processing of substrates in the film forming chambers C, D, and the like, the 1st substrate of the second lot is moved into the film forming chamber D to thereby perform the film forming processing during the time when the dummy sputtering processing is being performed in the film forming chamber C.

In the above-mentioned embodiment, the film forming processing of a TiN film by means of a reactive sputtering was exemplified as the predetermined processing, and the dummy sputtering processing was exemplified as the recovery processing, respectively. However, the predetermined processing and the recovery processing are not limited to the above examples. For example, other film forming processing and etching processing may be exemplified as the predetermined processing, and dry cleaning and seasoning may be exemplified as the recovery processing.

Further, in the above-mentioned embodiment, an arrangement was made to alternately transfer the substrates to the two film forming chambers C, D, thereby performing the film forming processing in parallel with each other. This invention can also be applied to the case in which the film forming processing is performed in parallel with one another by using three or more film forming chambers.

In the above-mentioned embodiments, a description was made of a case in which the throughputs of the two load-lock chambers A, B are higher than the throughput of one film forming chamber C (D) and are lower than the throughputs of the two film forming chambers C, D, i.e., of a case in which the throughputs of the two load-lock chambers cause bottlenecks, thereby giving rise to waiting time. However, this invention can also be applied to a case in which the throughput of the transfer robot 1 or the throughput of the robot 30 causes a bottleneck, thereby giving rise to waiting time. In such a case, the waiting time can also be effectively shortened as described above.

Further, in the above-mentioned embodiment, a description was made of a case in which there was employed the sputtering apparatus 100 having disposed therein load-lock chambers A, B and film forming chambers C, D in a manner to enclose the transfer chamber T. However, there may be employed a sputtering apparatus which is further provided, around the transfer chamber T, with two preprocessing chambers which perform preprocessing such as degassing prior to the film forming processing in the film forming chambers C, D. In this case, the substrates charged into the two load-lock chambers A, B are alternately transferred to the two preprocessing chambers, and the preprocessed substrates are alternately transferred to the two film forming chambers C, D, and the substrates that have been subjected to the film forming processing are returned to the load-lock chambers A, B. Then, if the substrate processing method according to this invention is applied to the case in which the waiting time occurs in the film forming chambers C, D because the throughput in the preprocessing chambers becomes the bottleneck, the waiting time can be effectively shortened as described above.

[Description of Reference Numerals and Characters]
C, D film forming chamber
S substrate

What is claimed is:

1. A substrate processing method, comprising:
    alternately transferring a substrate to at least two processing chambers, wherein same processing is performed on the substrate in each of the processing chambers, wherein recovery processing is performed to recover a state of each of the processing chambers when a number of substrates processed therein has reached a predetermined number, and wherein time required for the recovery processing is longer than time required for processing of substrates which includes move-in time, film forming time and move-out time:
    when the number of substrates processed in any one of the processing chambers has reached the predetermined number, starting the recovery processing in said any one of the processing chambers and, during the time until the recovery processing in said any one of the processing chambers is finished, transferring substrates only to the other of the processing chambers to thereby perform the processing of substrates;
    when the recovery processing in said any one of the processing chambers has been finished, starting the recovery processing in the other of the processing chambers and, during the time until the recovery processing in the other of the processing chambers is finished, transferring substrates only to said any one of the processing chambers to thereby perform the processing of substrates;
    resuming the alternate transferring of substrates when the recovery processing in the other of the processing chambers has been finished; and
    determining the time for starting the recovery processing in said any one of the processing chambers such that the recovery processing performed in said any one of the processing chambers is finished simultaneously with the time when the number of substrates processed in the other of the processing chambers has reached the predetermined number.

2. The substrate processing method according to claim 1, wherein the processing of substrates is the processing to form a titanium nitride film on a surface of each of the substrates by reactive sputtering using a Ti target, and wherein the recovery processing is a dummy sputtering in which the Ti target is sputtered while shielding the Ti target by a shutter which prevents the sputtered particles of the Ti target from getting scattered.

3. The substrate processing method according to claim 1, wherein the processing of substrates is the processing to form a titanium nitride film on a surface of each of the substrates by reactive sputtering using a Ti target, and wherein the recovery processing is a dummy sputtering in which the Ti target is sputtered while shielding the Ti target by a shutter which prevents the sputtered particles of the Ti target from getting scattered.

* * * * *